United States Patent [19]
Jung

[11] Patent Number: 5,959,922
[45] Date of Patent: Sep. 28, 1999

[54] FERROELECTRIC RANDOM ACCESS MEMORY DEVICE WITH REFERENCE CELL ARRAY BLOCKS

[75] Inventor: Dong-Jin Jung, Kyunggi-do, Rep. of Korea

[73] Assignee: Samsung Electronics Co., Ltd., Rep. of Korea

[21] Appl. No.: 09/137,034

[22] Filed: Aug. 20, 1998

[30] Foreign Application Priority Data

Aug. 30, 1997 [KR] Rep. of Korea ............... 97-43558

[51] Int. Cl.⁶ .................................. G11C 11/22
[52] U.S. Cl. .......................... 365/210; 365/145
[58] Field of Search ................... 365/210, 145, 365/189.01, 230.03

[56] References Cited

U.S. PATENT DOCUMENTS

| | | | |
|---|---|---|---|
| 5,148,063 | 9/1992 | Hotta | 307/530 |
| 5,268,861 | 12/1993 | Hotta | 365/104 |
| 5,349,563 | 9/1994 | Iwase | 365/230.01 |
| 5,754,466 | 5/1998 | Arase | 365/145 |
| 5,844,832 | 12/1998 | Kim | 365/210 |

OTHER PUBLICATIONS

Shoji et al., "A 7.03–$\mu m^2$ Vcc/2–plate Nonvolatile DRAM Cell with a Pt/PZT/Pt/TiN Capacitor Patterned by One–Mask Dry Etching," IEEE–1996 Symposium on VLSI Technology Digest of Technical Papers, pp. 28–29 (1996).

Koike et al., "A 60ns 1Mb Nonvolatile Ferroelectric Memory with Non–Driven Cell Plate Line Write/Read Scheme," ISSCC 96, Digest of Technical Paper, Session 23, DRAM, Paper SP23.1, pp. 473–475, Feb. 10, 1996.

Womack, "A 16kb Ferroelectric Nonvolatile Memory with a Bit Parallel Architecture," Session 16, Dynamic RAMs, ISSCC89Friday, Feb. 17, 1989, East Grand Ballroom/10:00 am.

IEEE Journal of Solid–State Circuits, vol. 23, No. 5, pp. 1171–1175, Oct. 1988, "An Experimental 512–bit Nonvolatile Memory with Ferroelectric Storage Cell".

*Primary Examiner*—Vu A. Le
*Attorney, Agent, or Firm*—Lappin & Kusmer LLP

[57] ABSTRACT

A ferroelectric random access memory device includes a plurality of reference cell array blocks implemented in a reference cell array. If the reference voltage from one of the reference cell array blocks is biased toward the voltage level of a logical data "1" or "0", another reference cell array block is chosen, which has ferroelectric capacitors of smaller or larger size than those of the selected reference cell array block. In this manner, the alternate reference cell array block provides the reference bit lines with required reference voltages. As a result, the sensing margin of the memory cells is increased, causing the reliability of the ferroelectric random access memory device to be improved.

8 Claims, 7 Drawing Sheets

(a)

(b)

(c)

FERROELECTRIC RANDOM ACCESS MEMORY DEVICE WITH REFERENCE CELL ARRAY BLOCKS

BACKGROUND OF THE INVENTION

Contemporary memory system designs employ a variety of memory devices, including semiconductor memory devices (e.g., dynamic RAM, static RAM, flash memory), magnetic discs and the like. With a wide variety of such devices available, and commonly used, it is a challenge to support all available memory space of, for example, a personal computer, using only a single type of memory device. Particularly, in the field of semiconductor memories, the development of devices to meet the requirements of high density, high-speed read/write operation, access time, low power consumption, etc. is an ongoing challenge, however there is an inevitable limit to technology speed and capacity of semiconductor.

To address this issue, a ferroelectric memory, which is nonvolatile, and therefore can retain data even when power is removed, has been realized through the use of a ferroelectric material, for example lead zirconate titanate (PZT), exhibiting hysterisis characteristics. Several examples of such ferroelectric memory technology are disclosed in the IEEE Journal of Solid-State Circuits, vol. 23, No. 5, pp. 1171~1175, October 1988, entitled "An Experimental 512-bit Nonvolatile Memory with Ferroelectric Storage Cell".

As well known in the art, a ferroelectric material has spontaneous polarization characteristics. The direction of the spontaneous polarization is controlled as a function of the direction of an applied electric field. Typical ferroelectric materials include the $ABO_3$ type of $PbZrO_3$ molecule. A metal atom, i.e., zirconium (Zr), positioned at the centra of the $PbZrO_3$ molecule has two stable states in accordance with the directions of an applied electric field. As a result, the ferroelectric material exhibits hysterisis characteristics in electric field and degree of polarization.

Ferroelectric random access memory (hereinafter referred to as "FRAM") is an example of a semiconductor memory device employing the hysterisis characteristics of ferroelectric material. Such FRAMs exhibit nonvolatile data storage characteristics by corresponding the degree of polarization to binary data. They are further capable of performing a read/write operation quickly by using a very last inverse polarization.

A conventional ferroelectric memory cell is now described with reference to FIG. 1 which is a circuit representation of a ferroelectric memory cell MC. The cell MC consists of an access transistor Tr (often referred to as a "select transistor" or "charge transfer transistor"), and a ferroelectric capacitor $C_F$. Such a configuration is suitable for memory devices with large scale capacity. In each FRAM memory cell MC, the ferroelectric capacitor $C_F$ is comprised of a ferroelectric material inserted between first and second electrodes (referred to as "plate electrodes" or "plates") thereof. The access transistor Tr is connected between a first electrode of capacitor $C_F$ and a bit line BL, and a gate thereof is connected to a word line WL. The second capacitor electrode is coupled to a plate line PL. Since FRAM transistors can be fabricated using a well-known CMOS fabrication technique, the FRAM can be advantageously applied to integration.

FIG. 2 is a hysterisis curve or hysterisis switching loop of the ferroelectric capacitor $C_F$. In this graph, the abscissa indicates a potential difference V (Volts) between the electrodes of the ferroelectric capacitor $C_F$, and the ordinate indicates the amount of charge induced to a surface of the ferroelectric material in accordance with spontaneous polarization, i.e., the degree of polarization $Q(\mu C/cm^2)$.

As shown in FIG. 2, if no electric field is applied to the ferroelectric material with a zero voltage applied thereto, no polarization is evident. When applied voltage is increased in the positive direction of the graph, the degree of polarization is increased from zero up to a point "A", in the positive charge polarization domain. At the point "A", all domains are polarized in one direction and the degree of polarization is maximized. At this level, the degree of polarization, i.e., the amount of charge in the ferroelectric material is indicated as Qs, and the applied voltage as the operation voltage Vcc. Following the initial charge, even though the voltage is lowered again to zero voltage, the degree of polarization is not reduced to zero, but remains at point "B", at a remanent degree of polarization Qr.

When a voltage is applied in the negative direction of the graph, the degree of polarization is changed from point "B" to a point "C" in the negative charge polarization domain. At point "C", all domains of the ferroelectric material are polarized in a reverse direction with respect to the polarization direction at point "A". The degree of polarization is then indicated as - Qs, and the applied voltage as the operation voltage -Vcc. Following the reverse charge, even though the voltage is lowered again to zero voltage, the degree of polarization is not reduced to zero, but remains at a point "D" at a remanent degree of polarization —Qr. If the voltage is increased in the positive direction, the degree of polarization reverses from point "D" to point "A".

As mentioned above, if a voltage is applied temporarily to the ferroelectric capacitor, even though its electrodes may be set to floating state, the polarization direction according to the spontaneous polarization can be continuously maintained. Because of the spontaneous polarization, surface charges of the ferroelectric material are not spontaneously dissipated due to leakage. When the applied voltage is reduced or removed, the polarization direction continues to be maintained.

Read and write operations can be effected in the FRAM by polarization reversal, and therefore the operation speed thereof is determined by the time of such reversal. The speed of polarization reversal in the ferroelectric capacitor is determined by the capacitor area, a thickness of ferroelectric thin film, the applied voltage, etc. The unit of the speed of polarization reversal is commonly measured in microseconds ($\mu s$). The FRAM can therefore be operated at a faster rate than electrically erasable and programmable read only memory (EEPROM) or flash memory. Read and write operations of the FRAM will now be described.

In the FRAM, a binary data signal corresponds to remanent points "B" and "D" of the hysterisis loop shown in FIG. 2. Logical "1" corresponds to point "B", and logical "0" corresponds to point "D".

Returning to FIG. 1, at an initial stage of the read and write operation of the FRAM, an operation for sensing data stored in the memory cells is performed. During the sensing operation, the bit line BL is maintained at a floating state. The access transistor Tr is then activated by the word line WL so that the zero voltage on the bit line BL is applied to the first electrode of the ferroelectric capacitor $C_F$, and a pulse signal of Vcc level is applied to the second electrode thereof via plate line PL. At this time, if a "1" data value is stored in the ferroelectric capacitor $C_F$, the degree of polarization of the capacitor $C_F$ is varied from the point "B" to the point "D" via the point "C". As a result, a charge amount of dQ is transmitted from the ferroelectric capacitor $C_F$ to the bit line BL, and thereby the voltage on the bit line BL is increased.

Reversely, if a logical data "0" is stored in the capacitor $C_F$, the degree of polarization of the capacitor $C_F$ is varied from point "D" to point "C" and returns to point "D". In this case, the voltage on the bit line BL does not change. The bit line voltage is compared with a reference voltage by means of a well-known sense circuit. If the bit line voltage is greater than the reference voltage, it is increased to an operational voltage level (i.e., Vcc level). If not, the bit line voltage is lowered again to zero voltage.

Following completion of the above-mentioned data sensing operation, a data read/write operation begins. During a data write operation, a voltage on a data line, for example, a voltage at Vcc level (i.e., logical data "1") or zero level (i.e., logical data "0"), is delivered to the bit line BL by means of a column selector. Following a lapse of a predetermined time amount, a pulse signal is applied to the ferroelectric capacitor $C_F$. The degree of polarization of the ferroelectric capacitor $C_F$ is then varied from point "B" to point "D" so that a logical data "1" or "0" data is written in the memory cell.

If the sensing operation is performed with respect to a memory cell which stores a logical data "1" (i.e., the degree of polarization of Qr at the point "B") or if a pulse signal is applied to the ferroelectric capacitor $C_F$ which stores a logical data "1", the stored data becomes a logical data "0" (i.e., the degree of polarization of —Qr at the point "D") because of the hysterisis characteristics of the ferroelectric capacitor $C_F$. Therefore, before the completion of the write operation, it is necessary to allow for the recovery of data states of the respective ferroelectric capacitors $C_F$ of nonvolatile-selected memory cells connected in common to the word line WL to an initial state. This data recovery is called "rewrite" or "restore". The Vcc level of pulse signal is applied once more to the ferroelectric capacitor $C_F$ of the memory cell whose sensing operation is completed. Thus, the degree of polarization of the ferroelectric capacitor CF of each of the nonvolatile-selected memory cells is recovered from —Qr (indicating the logical data "0") at point "D" to Qr (indicating the logical data "1") at point "B".

During a read operation, data on the bit line BL obtained by the data sensing operation is delivered directly to the data bus. During the read operation, if the sensing operation is carried out with respect to the cell which stores a logical data "1", the data stored in the ferroelectric capacitor $C_F$ is changed to a logical data "0". Therefore, before the completion of the read operation, a Vcc pulse is applied once more to the ferroelectric capacitor $C_F$ of the memory cell whose sensing operation is completed. Thus, the degree of polarization of the ferroelectric capacitor $C_F$ recovers from —Qr to Qr at point "B".

A reference cell array for providing the reference voltage to the sense circuit incorporates a plurality of reference cells, each of which comprises an access transistor and a ferroelectric capacitor, as in the memory cell MC. The ferroelectric capacitor of each of the reference cells is similar in size to that of the memory cell MC. That is, it is formed so as to exhibit identical hysterisis characteristics to that of the memory cell MC. As well-known in the art, the reference voltage, which is typically half of the sum of the voltage level of a logical data "1" and the voltage level of a logical data "0", is produced by using two reference cells having the same hysterisis characteristics as that of the memory cell MC, respectively. The generated reference voltage is delivered onto a reference bit line corresponding to a plurality of memory cells.

In applying such a reference cell array to the FRAM, the reference voltage level is half of the sum of the voltage level of a logical data "1" and the voltage level of a logical data "0" (case C), as illustrated in FIG. 3. However, if a ferroelectric capacitor of the reference cell has a degree of polarization which is different from that of each of the corresponding memory cells, then, as a result, the reference voltage therefrom to be provided on the reference bit line may be biased toward either the voltage level of a logical data "1" or the voltage level of a logical data "0". As illustrated in FIG. 3, if the reference voltage level on the reference bit line is biased toward the logic data "1" (case A), the sensing margin for memory cells storing the logical data "1" is decreased. Likewise, if the reference voltage level thereon is biased toward the logical data "0" (case B), the sensing margin for memory cells storing the logical data "0" is decreased.

Unlike dynamic random access memory, it is difficult or impossible to adjust the reference voltage bias level inside a FRAM. Therefore, the possibility of data failure for the memory cells associated with the reference bit line of the biased reference voltage level is more likely increased therein. Accordingly, the reliability of the FRAM is lowered.

SUMMARY OF THE INVENTION

To address the aforementioned limitations of conventional techniques, the present invention is directed to a ferroelectric random access memory device having ferroelectric memory cells, and more particularly to a FRAM device having a plurality of reference cell array blocks.

It is therefore an object of the present invention to provide a ferroelectric random access memory device having improved reliability.

It is another object of the invention to provide a ferroelectric random access memory device having a plurality of reference cell array blocks so that an appropriate biased reference voltage level can be selected for proper device operation.

In order to attain the above objects, according to an aspect of the present invention, there is provided a ferroelectric random access memory device. The device comprises a memory array having a plurality of memory bit lines, a plurality of memory word lines intersecting the memory bit lines, and a plurality of ferroelectric memory cells each arranged at intersections of the memory bit lines and the memory word lines. The device further comprises a reference cell array having a plurality of reference bit lines each corresponding to the memory bit lines and having a plurality of reference cell array blocks coupled in parallel to the reference bit lines, each of which has a reference word line and a plurality of reference cells, each arranged at intersections of the reference word line and the reference bit lines. The device further includes a sense amplifier connected to the memory bit lines and the reference bit lines, for sensing and amplifying data stored in the ferroelectric memory cells by using a reference voltage from the reference cell array. According to the device of the present invention, each of the reference cell array blocks generates a different reference voltage. The reference voltage level to be used by the sense amplifier is selectable by reference cell array block.

In a preferred embodiment, each of said reference cells in the respective reference cell array blocks comprises a ferroelectric capacitor. Each of the ferroelectric capacitors within one the reference cell array blocks has a capacitance value similar to that of each of the ferroelectric memory cells. The others of the reference cell array blocks each have ferroelectric capacitors of a capacitance value larger and/or smaller than that those of the ferroelectric memory cells.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 4:
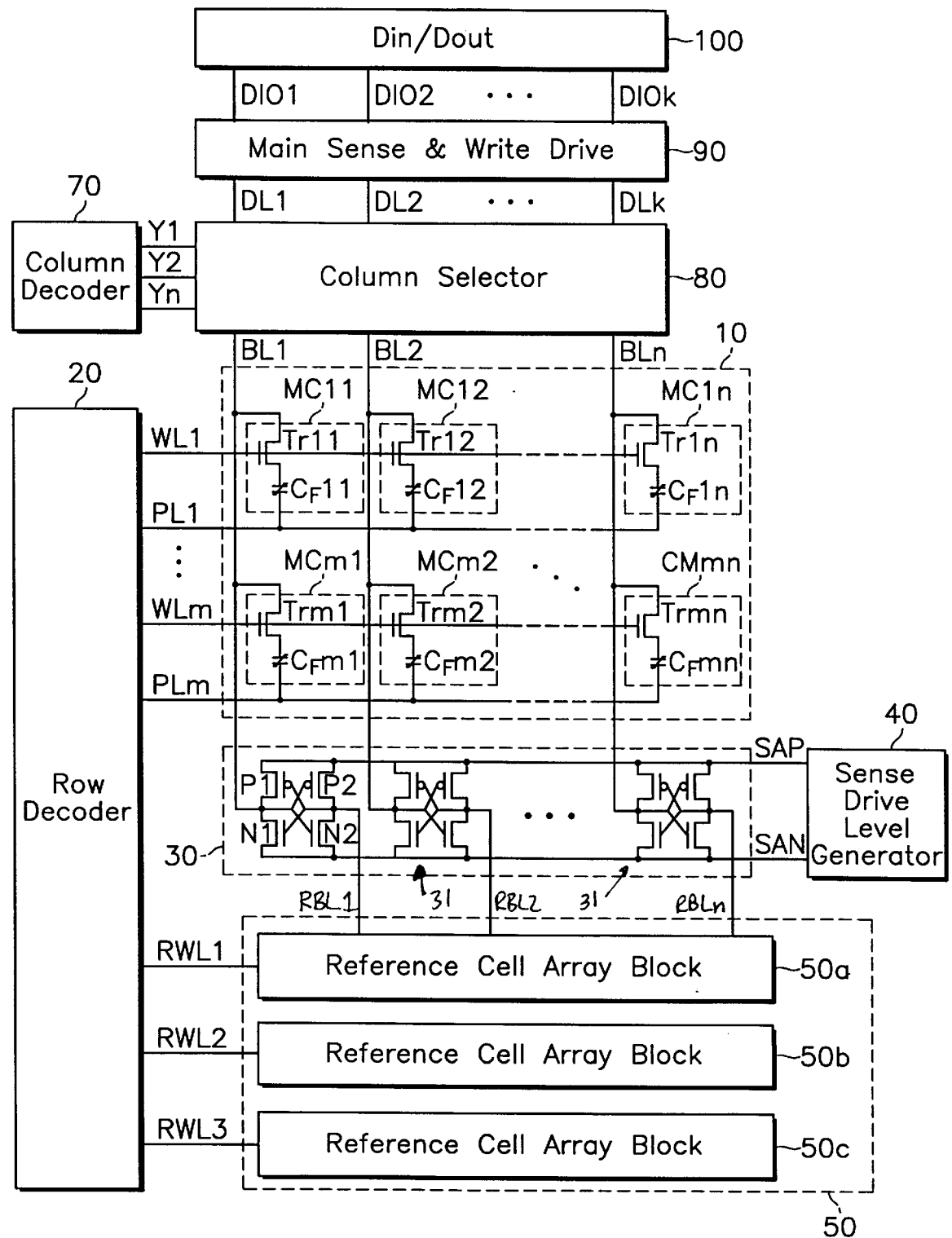
FIG. 4 is a schematic block diagram of a ferroelectric random access memory device according to an embodiment of the present invention.

With reference to the schematic block diagram of FIG. 4, a ferroelectric random access memory (FRAM) device of present invention includes a plurality of reference cell array blocks 50a, 50b, 50c implemented in a reference cell array 50. If the reference voltages from one selected from the reference cell array blocks 50a, 50b, 50c are biased toward the logical data "1" or "0", then another reference cell array block is selected having ferroelectric capacitors of smaller or larger capacitance value than that of the originally-selected reference cell array block. The chosen reference cell array block therefore provides the reference bit lines with required reference voltages. As a result, the memory cell sensing margin becomes larger, improving FRAM reliability. Such selection of appropriate reference cell array block is preferably accomplished at the wafer level of device fabrication.

The PRM comprises a memory cell array 10, a row decoder circuit 20, a sense circuit 30, a sense drive level generator 40, a reference cell array 50, a column decoder circuit 70, a column selection circuit 80, a main sense&write drive circuit 90 and a data input/output circuit 100. Although not shown in the figure, the FRAM further comprises a well-known bit line precharge circuit for precharging the bit lines to a preset voltage level (e.g., a Vss level).

As shown in FIG. 4, the memory cell array 10 is comprised of a plurality of word lines WL1~WLm, a plurality of plate lines PL1~PLm arranged in m rows and extending in the word line direction, and a plurality of bit lines BL1~BLn arranged in columns so as to intersect the word lines WL1~WLm and plate lines PL1~PLm. The memory cell array 10 further comprises m×n ferroelectric memory cells MCmn arranged at intersections of the word lines WL1~WLm and the bit lines BL1~BLn.

Each memory cell MCmn is comprised of an access transistor (or a charge transfer transistor) Trij and a ferroelectric capacitor $C_Fij$, where i indicates an integer of 1 to m and j indicates an integer of 1 to n. A ferroelectric material is inserted between the electrodes of the capacitor $C_Fij$. A current path of the access transistor Trij, i.e., a drain-source channel, lies between a first electrode of the ferroelectric capacitor $C_Fij$ and a corresponding bit line BLj. A gate of the transistor Trij is connected to a corresponding word line WLi. The second electrode of the ferroelectric capacitor $C_Fij$ is connected to a corresponding plate line PLi. For example, the current path of the access transistor Tr11 is between the first electrode of the ferroelectric capacitor $C_F11$ and the bit line BL1, and a gate thereof is connected to the word line WL1. The second electrode of the ferroelectric capacitor $C_F11$ is connected to the plate line PL1 corresponding to the word line WL1.

The word lines WL1~WLm and the plate lines PL1~PLm are connected to the row decoder circuit 20, respectively. When a word line WLi is selected, a plate line PLi corresponding to the selected word line WLi is selected by the row decoder circuit 20. The selected word line WLi is driven with a Vcc voltage and the selected plate line PLi is driven by plate pulse signal from the plate pulse generator (not shown) so as to drive all polarization domains of the ferroelectric material to a state of complete directional polarization.

An end of each bit line BLj is connected to the sense circuit 30 and the other thereof to the column selection circuit 80. The sense circuit 30, comprising n sense amplifiers 31, is connected to two sense drive lines SAP and SAN from the sense drive level generator 40, n bit lines BL1~BLn of the memory cell array 10 and n reference bit lines RBL1~RBLn of the reference cell array 50.

Each sense amplifier 31 is comprised of two CMOS circuits, each of which comprises PMOS and NMOS transistors, as shown in FIG. 4. In the first CMOS circuit, current paths of transistors P1 and N1 are connected in series between the sense drive lines SAP and SAN, and gates thereof are commonly connected to a corresponding reference bit line REFj, where j indicates an integer of 1 to n. In the second CMOS circuit, current paths of the transistors P2 and N2 are also connected in series between the sense drive lines SAP and SAN, and gates thereof are commonly connected to a corresponding bit line BLj, where j indicates an integer of 1 to n. Two complementary sense drive signals from the sense drive level generation circuit 40 are respectively applied to the sense drive lines SAP and SAN.

The reference cell array 50 is comprised of a plurality of reference cell array blocks 50a, 50b, 50c. The reference cell array blocks are connected in common to the reference bit lines RBL1~RBLn and are coupled to the row decoder circuit 20 through corresponding reference word lines RWL1, RWL2, and RWL3. At least one of the reference cell array blocks is selected during a wafer test mode. The selected reference cell array block provides the reference bit lines RBL1~RBLn with reference voltages which, optimally has a voltage level corresponding to half of the sum of the voltage level of a logical data "1" and the voltage level of a logical data "0".

The reference voltages from the selected reference cell array block may be biased toward the voltage level of the logical data "1" or toward the voltage level of the logical data "0" for various reasons, for example, due to a fabrication process variation. Whether appropriate reference voltages are produced from the selected reference cell array is preferably tested using well-know test equipment during wafer testing. The biased reference voltages from the selected reference cell array block can be adjusted by deactivating the originally-selected reference cell array block, and activating another having capacitance values which are more conducive to applying a proper reference voltage. Again, such selection is preferably accomplished during wafer testing, before the memory circuits are diced and packaged. Although not shown in the figure, the reference cell array blocks may be selected by use of a redundant technique, for example using a plurality of laser fuses, as is well-known in the art.

If the reference voltages from an originally-selected reference cell array block are biased toward the voltage level of logical data "1", an alternative reference cell array block is chosen which has ferroelectric capacitors of smaller capacitance than those of the originally-selected reference cell array block. If the reference voltages from the originally-selected reference cell array are biased toward the voltage level of logical data "0", an alternative reference cell array block is chosen, which has ferroelectric capacitors of larger capacitance than those of the originally-selected reference cell array block. In this manner, the newly-selected reference cell array block provides the reference bit lines RBL1~RBLn with required reference voltages during the wafer level.

Returning to FIG. 4, the column selection circuit 80 is comprised of n NMOS transistor (not shown) as selection transistors. Each of current paths of the selection transistors is connected between a corresponding bit line BLj and a corresponding data line DLy, where y indicates an integer of 1 to k. The respective selection transistors are activated/deactivated in response to respective column selection signals Y1~Yn from the column decoder circuit 70. The main sense&write drive circuit 90 and data input/output circuit 100 are well-known in the art a therefore descriptions thereof are omitted below.

Detailed circuits of the reference cell array blocks according to the preferred embodiment of the present invention are now described with reference to FIGS. 5A, 5B and 5C.

Figure 5A:
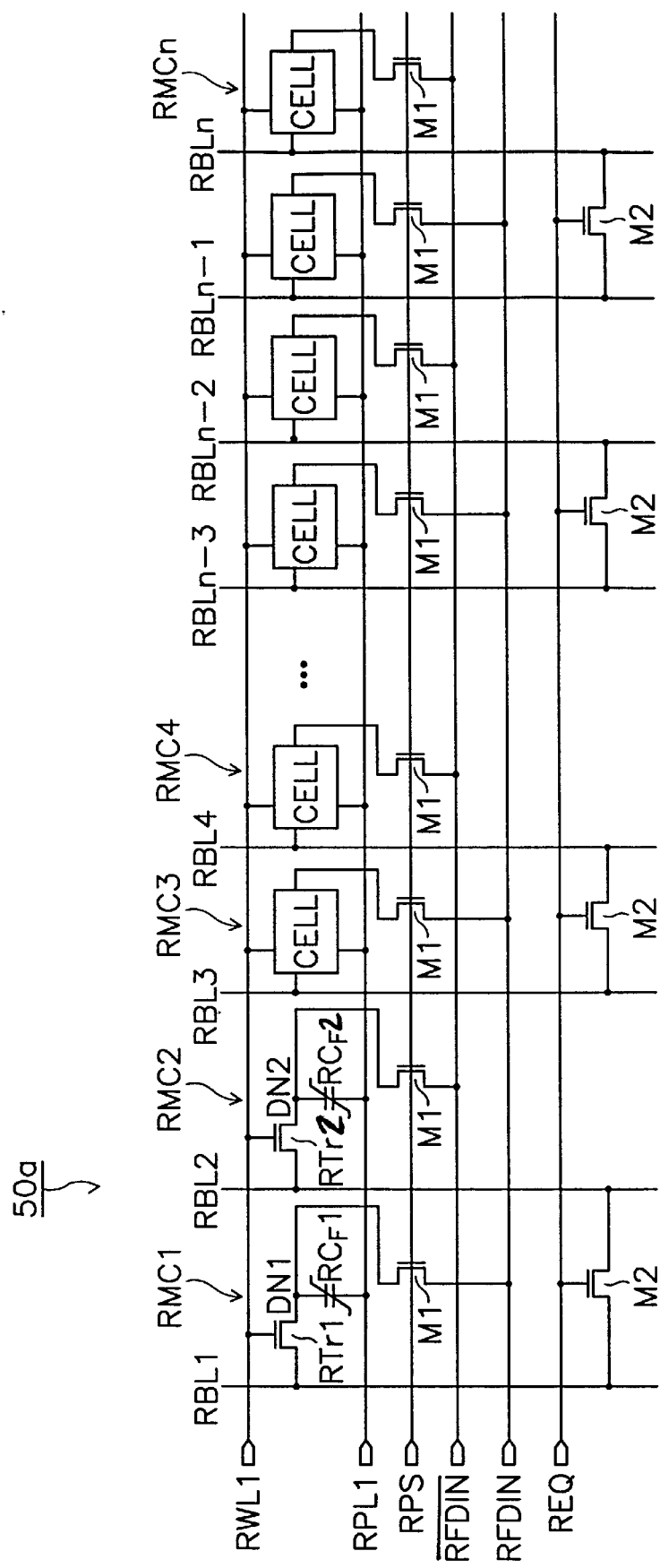
FIGS. 5A through 5C are schematic circuit diagrams of reference cell array blocks according to the present invention.

Referring to FIG. 5A, a first reference cell array block 50a comprises a plurality of reference cells RMC1~RMCj, where j is an integer of 1 to n. Each of the reference cells comprises an access transistor RTr1 and a ferroelectric capacitor $RC_F1$. The reference capacitors $RC_F1$ are fabricated such that the capacitance of the ferroelectric capacitors are identical to those of memory cell array 10 in FIG. 4. A first electrode of each ferroelectric capacitor $RC_F1$ is coupled to an access transistor RTr1, and a second electrode thereof is joined to a reference plate line RPL1. The first electrodes of the reference cells RMC1~RMCn are connected alternately to RFDIN and /RFDIN lines through NMOS transistors M1 activated in common by an RPS signal. For example, a first electrode of capacitor $RC_F2$ of reference cell RMC1 is connected to the RFDIN line through NMOS transistor M1 and the first electrode of the capacitor $RC_F1$ of reference cell RMC2 is connected to the /RFDIN line through the NMOS transistor M1. Respective pairs of reference cells MC(j-1) and MCj store complementary data to each other. For example, a reference cell MC1 stores a logical data "1" and a reference cell MC2 stores a logical data "0", and vice versa. Between reference bit line pairs RBL(j-1) and RBLj, NMOS transistors M2 are activated according to a voltage level of a REQ signal. If the REQ signal is active, the NMOS transistors M2 are activated, causing the respective reference bit line pairs to have an identical voltage level (that is, to be equalized).

Figure 5B:
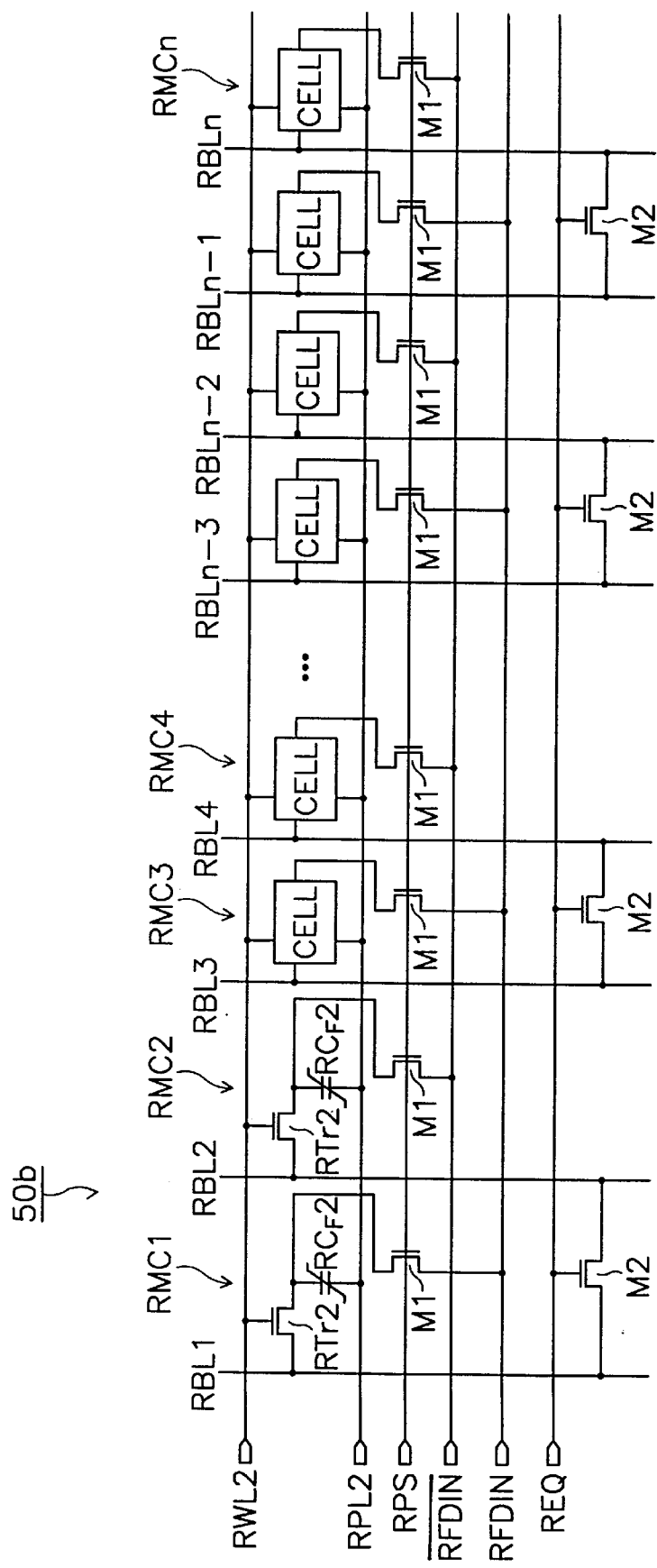
Figure 5C:
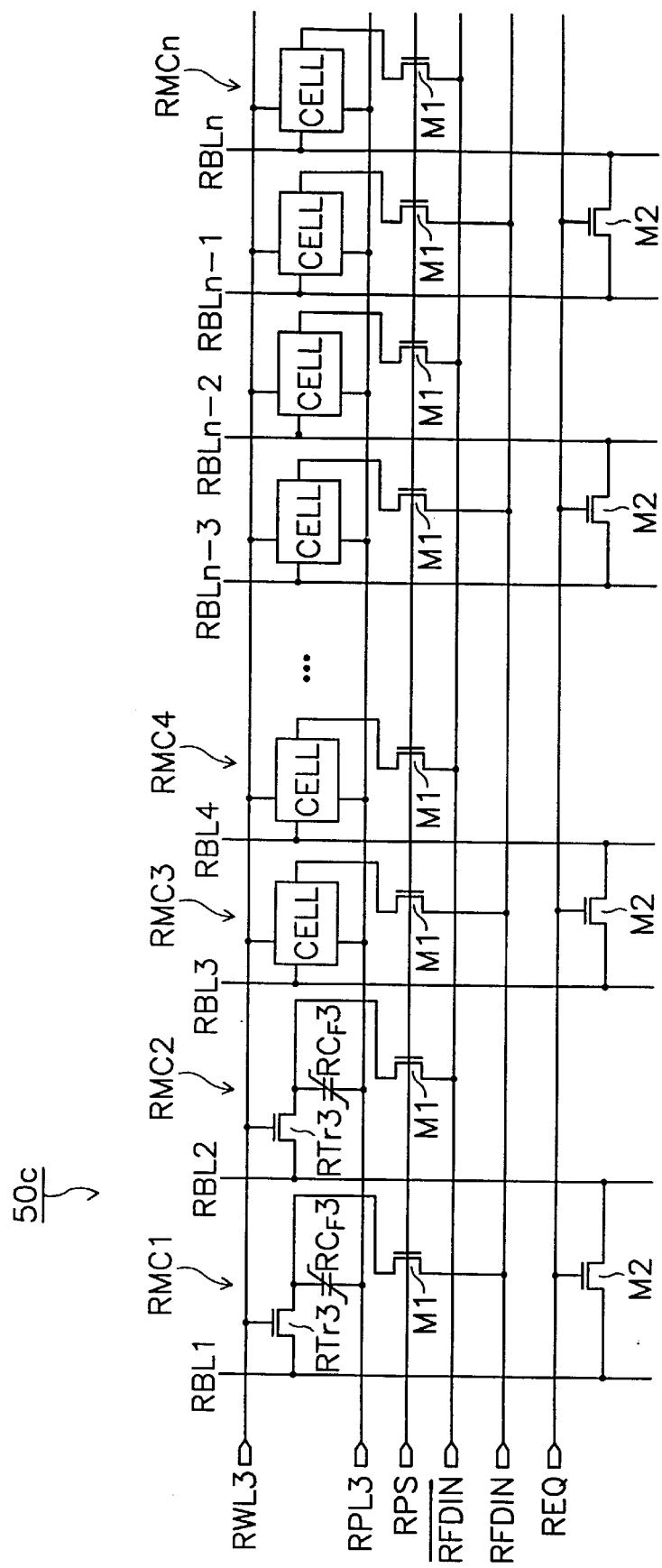

In FIGS. 5B and 5C, the constituent elements that are identical to those of FIG. 5A are labeled with the same reference numerals. The reference cell array block 50b of FIG. 5B differs from the reference cell array block 50a in FIG. 5A only in that ferroelectric capacitors $RC_F2$ of reference cells RMC1~RMCn are smaller in capacitance value than those of the reference cell array block 50a in FIG. 5A. The reference cell array block 50c of FIG. 5C differs from the reference cell array block in FIG. 5A only in that ferroelectric capacitors $RC_F3$ of reference cells RMC1~RMCn are larger in capacitance value than those of the reference cell array block 50a in FIG. 5A.

The operation of the reference cell array block 50a is now described. For the purpose of description, the operation of the reference cell array block 50a is described by using only two reference cells RMC1 and RMC2. Assume that reference cell RMC1 stores a logical data "1" (in FIG. 2, point "B") and reference cell RMC2 stores a logical data "0" (in FIG. 2, point "D").

Figure 1:
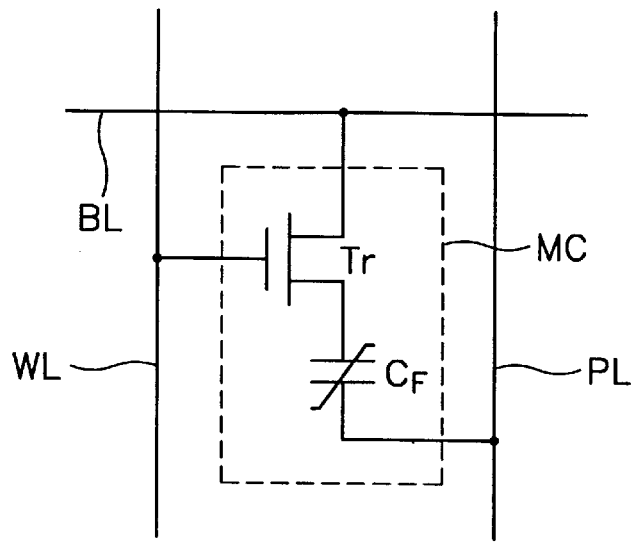
FIG. 1 is a schematic circuit representation of a ferroelectric memory cell.
Figure 2:
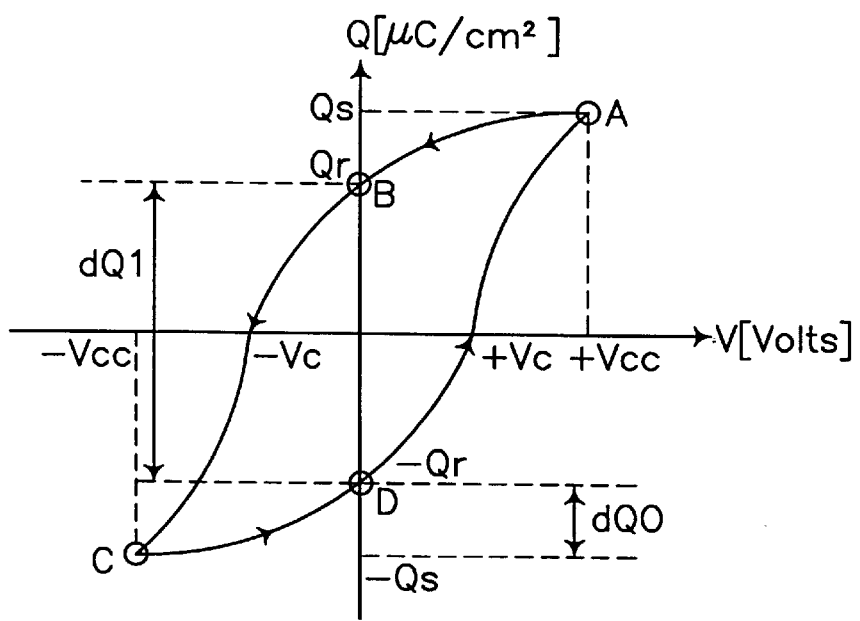
FIG. 2 is a graph illustrating the hysteresis characteristics of a ferroelectric capacitor.

The access transistors RTr1 are activated by reference word line RWL1 so that a zero voltage on corresponding reference bit lines RBL1 and RBL2 is applied to the first electrodes or the ferroelectric capacitors $RC_F1$, and a pulse signal of Vcc level is applied to the second electrodes thereof via the reference plate line RPL1. At this time, the degree of polarization of the capacitor $RC_F1$ is varied from point "B" to point "D" via point "C" as illustrated in FIG. 2. As a result, a charge amount of dQ is transmitted from the ferroelectric capacitor $RC_F1$ to the reference bit line RBL1, and thereby the voltage on the reference bit line RBL1 is increased. Reversely, the degree of polarization of the capacitor $RC_F2$ is varied from point "D" to point "C" and returns to point "D". In this case, the voltage on the reference bit line RBL2 is not changed.

When the REQ signal line is driven to a high level, the NMOS transistors M1 are activated, causing voltages on the reference bit lines RBL1 and RBL2 to be equalized. That is, the voltages on the reference bit lines RBL1 and RBL2 become reference voltages to be provided to the sense circuit 30 in FIG. 4. Following a read/write operation, the RFDIN and /RFDIN lines are driven at low level (e.g., a Vss level) and at high level (e.g., a Vcc level), respectively. As this time, the degree of polarization of the capacitor $RC_F1$ is varied from point "D" to point "B" via point "A" and the degree of polarization of the capacitor $RC_F2$ is varied from point "D" to point "C" and returns to point "D", as illustrated in FIG. 2. Accordingly, logical data "1" is rewritten to reference cell RMC1 and logical data "0" is rewritten to reference cell RMC2.

When one of the reference cell array blocks 50b and 50c in FIGS. 5B and 5C is employed instead of the reference cell array block 50a in FIG. 5A by using the aforementioned redundant technique, the alternate selected block 50b or 50c generates the reference voltages to be provided onto the reference bit lines RBL1~RBLn in the above-mentioned manner.

As described above, the capacitance values of ferroelectric capacitors $RC_F1$ of reference cell array block 50a are preferably identical to those of memory cell array 10, while the capacitance values of ferroelectric capacitors $RC_F2$ of the reference cell array block 50b are less than those of memory cell array 10, and the capacitance values of ferroelectric capacitors $RC_F3$ of the reference cell array block 50c are larger than those of memory cell array 10.

Figure 3:
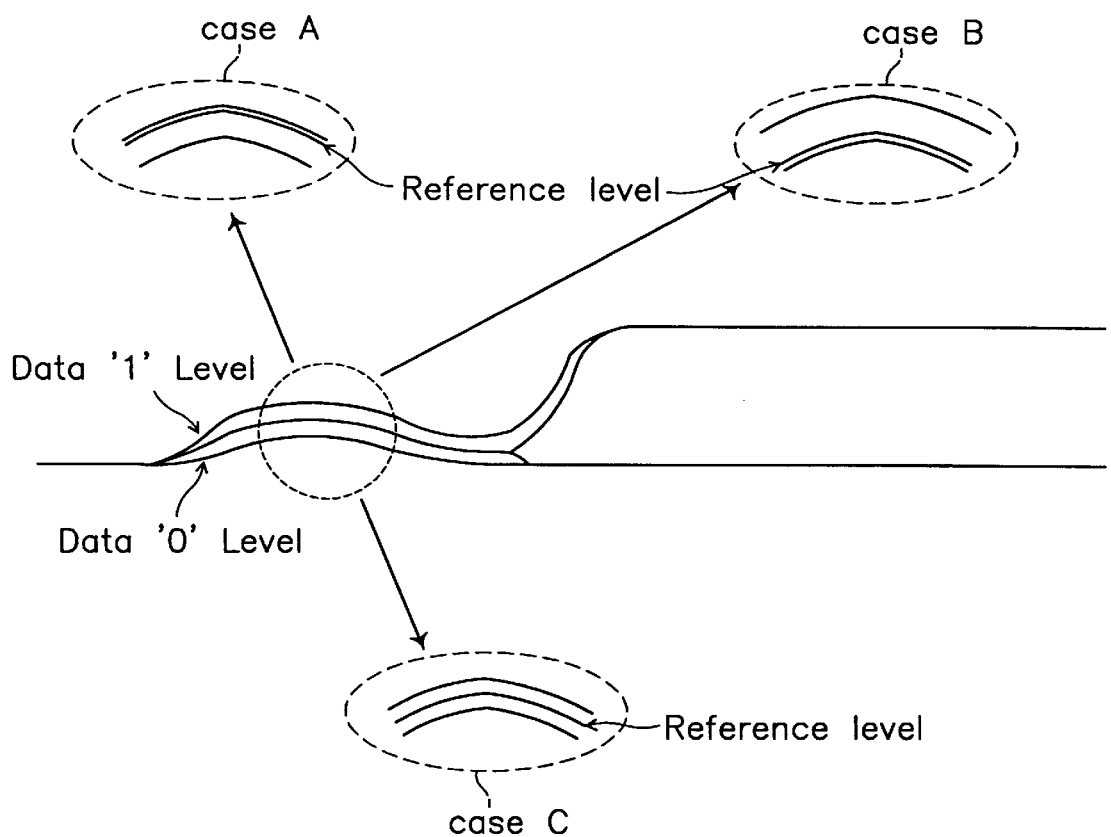
FIG. 3 is a diagram for describing the shortcomings of a conventional ferroelectric random access memory device.
Figure 6:
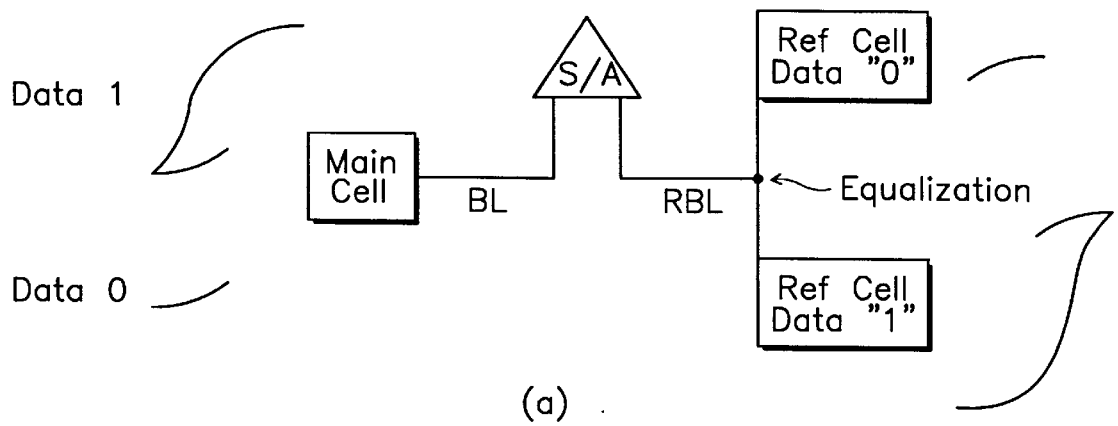
FIG. 6 is a diagram for describing the improvement achieved by the present invention.
Figure 6:
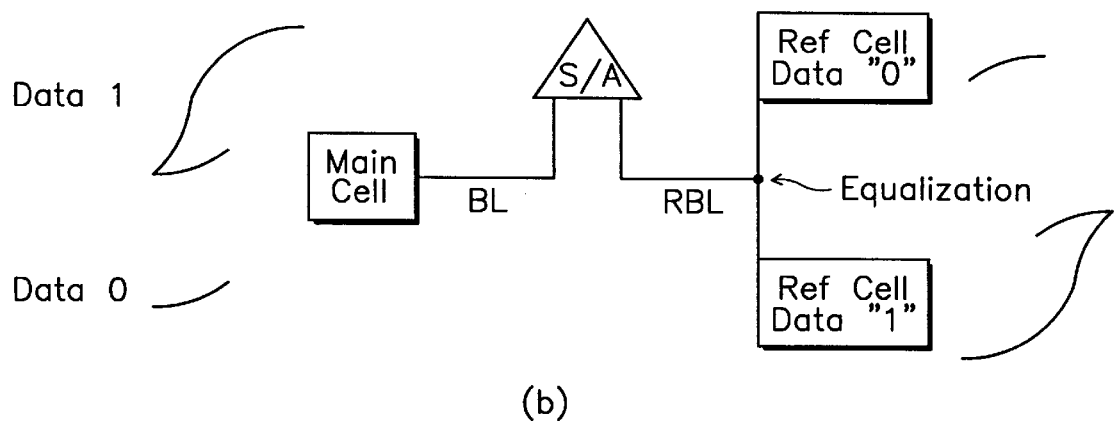
Figure 6:
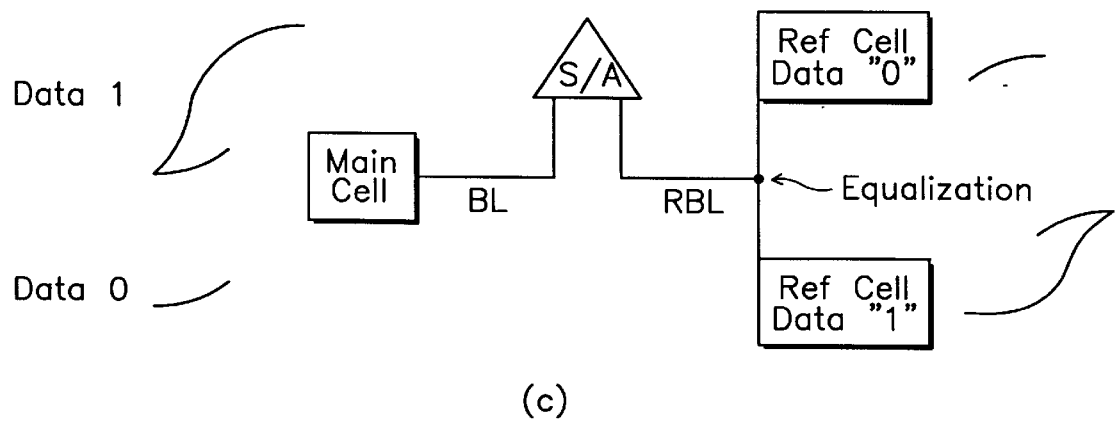

In the event that the reference voltage from reference cell array block 50a is biased toward a voltage level of a logical data "1" (case A) as illustrated in FIG. 3, that is, when a ferroelectric capacitor $RF_C1$ storing a logical data "1" is switched, its switching loop (from point "B" to point "D" via point "C") is larger than that of memory cell MCij as illustrated in FIG. 6 (case A), the reference cell array block 50a is deactivated, and a second reference cell array block 50b is chosen (by using the aforementioned redundant selection technique) which has ferroelectric capacitors $RC_F2$, each having a smaller capacitance value than that of memory cell array 10, as described above. This enables the reference cell array block 50b to generate proper reference voltages, which are half the sum of voltages respectively corresponding to data "1" and data "0", onto the reference bit lines RBL1~RBLn. As a result, the biased reference voltage may be adjusted to a proper reference voltage according to the above-described technique.

In the event that the reference voltage from reference cell array block 50a is biased toward a voltage level of a logical data "0" (case B) as illustrated in FIG. 3, that is, when a ferroelectric capacitor $RC_F2$ storing a logical data "1" is switched, its switching loop (from point "B" to point "D" via point "C") is smaller than that of memory cell MCij as illustrated in FIG. 6 (case C), the reference cell array block 50a is deactivated, and a third reference cell array block 50c is chosen (by using the aforementioned redundant selection technique) which has ferroelectric capacitors $RC_F3$, each having a larger capacitance value than that of memory cell array 10, as described above. This enables the reference cell array block 50c to generate reference voltages, which are half the sum of voltages respectively corresponding to data "1" a data "0", onto the reference bit lines RBL1~RBLn. As a result, the biased reference voltage may be adjusted to a proper reference voltage.

Although two additional reference cell array blocks 50b and 50c are incorporated in the reference cell array 50 for the purposes of describing the invention, additional reference cell array blocks can be implemented therein, although not shown in figure, so that a biased reference voltage can be selected and tested incrementally to enable more accurate adjustment thereof.

While this invention has been particularly shown and described with references to preferred embodiments thereof, it will be understood by those skilled in the art that various changes in form and details may be made therein without departing from the spirit and scope or the invention as defined by the appended claims.

What is claimed is:

1. A nonvolatile semiconductor memory device comprising:

a memory array having a plurality of memory bit lines, a plurality of memory word lines intersecting the memory bit lines, and a plurality of ferroelectric memory cells each arranged at intersections of the memory bit lines and the memory word lines;

a reference cell array having a plurality of reference bit lines corresponding to the memory bit lines and having a plurality of reference cell array blocks coupled in parallel to the reference bit lines, each of which has a reference word line and a plurality of reference cells each arranged at intersections of the reference word line and the reference bit lines; and a sense amplifier connected to the memory bit lines and the reference bit lines, for sensing and amplifying data stored in the ferroelectric memory cells by using a reference voltage from the reference cell array;

wherein each of the reference cell array blocks generates a different reference voltage and wherein the reference voltage level to be used by the sense amplifier is selectable by reference cell array block.

2. The nonvolatile semiconductor memory device of claim 1, wherein each of said reference cells in each respective reference cell array blocks comprises a ferroelectric capacitor, wherein the ferroelectric capacitors of a first reference cell array block have a capacitance substantially equal to the capacitance of the ferroelectric memory cells.

3. The nonvolatile semiconductor memory device of claim 2, wherein the remaining reference cell array blocks each have ferroelectric capacitors of capacitance value different from those of the ferroelectric memory cells.

4. The nonvolatile semiconductor memory device of claim 1, wherein a first reference cell array block includes ferroelectric capacitors having a capacitance value substantially equal to the capacitance of the ferroelectric memory cells, and wherein the other reference cell array blocks include ferroelectric capacitors having capacitance values less than and greater than the capacitance of the ferroelectric memory cells.

5. A nonvolatile semiconductor memory device comprising: a plurality of ferroelectric memory cells, the data values of which are sensed as a function of reference voltage; and a corresponding plurality of reference cells, the reference cells being arranged in a plurality of selectable reference cell blocks, each reference cell block providing a different reference voltage to the memory cells, such that reference voltage is selectable as a function of reference cell block.

6. The nonvolatile semiconductor memory device of claim 5, wherein each of said reference cells in each respective reference cell array blocks comprises a ferroelectric capacitor, wherein the ferroelectric capacitors of a first reference cell array block have a capacitance substantially equal to the capacitance of the ferroelectric memory cells.

7. The nonvolatile semiconductor memory device of claim 6, wherein the remaining reference cell array blocks each have ferroelectric capacitors of capacitance value different from those of the ferroelectric memory cells.

8. The nonvolatile semiconductor memory device of claim 5, wherein a first reference cell array block includes ferroelectric capacitors having a capacitance value substantially equal to the capacitance of the ferroelectric memory cells, and wherein the other reference cell array blocks include ferroelectric capacitors having capacitance values less than and greater than the capacitance of the ferroelectric memory cells.

* * * * *